US006236189B1

(12) United States Patent
Franke

(10) Patent No.: US 6,236,189 B1
(45) Date of Patent: May 22, 2001

(54) METHOD FOR DETERMINING A CHARGE STATUS OF A BATTERY

(75) Inventor: Michael Franke, Darmstadt (DE)

(73) Assignee: Braun GmbH, Kronberg (DE)

( * ) Notice: Subject to any disclaimer, the term of this patent is extended or adjusted under 35 U.S.C. 154(b) by 0 days.

(21) Appl. No.: 09/468,680

(22) Filed: Dec. 21, 1999

(30) Foreign Application Priority Data

Feb. 11, 1999 (DE) ............................................... 199 05 550

(51) Int. Cl.⁷ .................................................... H02J 7/00
(52) U.S. Cl. ............................................ 320/136; 320/135
(58) Field of Search ................................... 320/136, 135, 320/132; 324/427, 428, 426

(56) References Cited

U.S. PATENT DOCUMENTS

| 4,849,681 | * | 7/1989 | Munning Schmidt et al. | ..... 320/133 |
| 5,287,286 |   | 2/1994 | Ninomiya | ............................... 320/106 |
| 5,663,613 | * | 9/1997 | Yamashita et al. | .................... 315/308 |
| 5,804,894 |   | 9/1998 | Leeson et al. | ........................ 324/433 |
| 5,973,497 | * | 10/1999 | Bergk et al. | .......................... 324/428 |

FOREIGN PATENT DOCUMENTS

| 4131981 A1 | 4/1993 | (DE) . |
| 3875662 T2 | 5/1993 | (DE) . |
| 4241975 C1 | 4/1994 | (DE) . |
| 3850744 T2 | 2/1995 | (DE) . |
| 4437647 A1 | 5/1996 | (DE) . |
| 0 884 600 A2 | 5/1998 | (EP) . |

* cited by examiner

Primary Examiner—Peter S. Wong
Assistant Examiner—Lawrence Luk
(74) Attorney, Agent, or Firm—Fish & Richardson P.C.

(57) ABSTRACT

The invention is directed to a method for determining the status of a primary or secondary battery in which said battery is discharged to a specific residual charge. Following a replacement or full charge of the battery, the invention provides for a measurement of the time which elapses until the battery voltage has dropped to a first voltage threshold value. Then the first voltage threshold value is lowered by an amount dependent on the measured discharge time. It is only the dropping of the battery voltage to the lowered voltage threshold value which is taken as an indicator for the battery's discharge to the residual charge.

15 Claims, 1 Drawing Sheet

METHOD FOR DETERMINING A CHARGE STATUS OF A BATTERY

This invention relates to a method for determining and indicating the status of a primary or secondary battery in which said battery is discharged to a minimal residual charge.

Two versions of an electric apparatus designed to be operated with a rechargeable battery and having a charge status indicator are known from DE 41 31 981 A1. In the case of the first version the charge status is indicated simply by means of the time, measured by a counter, which the apparatus spends connected to the battery. This indicator produces exact values only if the current consumption of the apparatus and the capacitance of the battery are constant. In the case of the second version the charge status indicator is controlled by a counter and a voltage discriminator which detects a specific threshold value of the battery voltage. Indication of the charge status takes place likewise by means of the time, measured by the counter, which elapses until the battery voltage has dropped to the threshold voltage. Thereupon a counter is started, specifying a specific residual operating time which is likewise indicated. With advanced aging of the battery and/or pronounced memory effect this indicator will indicate "zero" when the apparatus could in fact remain in operation for a certain time longer with the residual charge still available.

Figure 1:
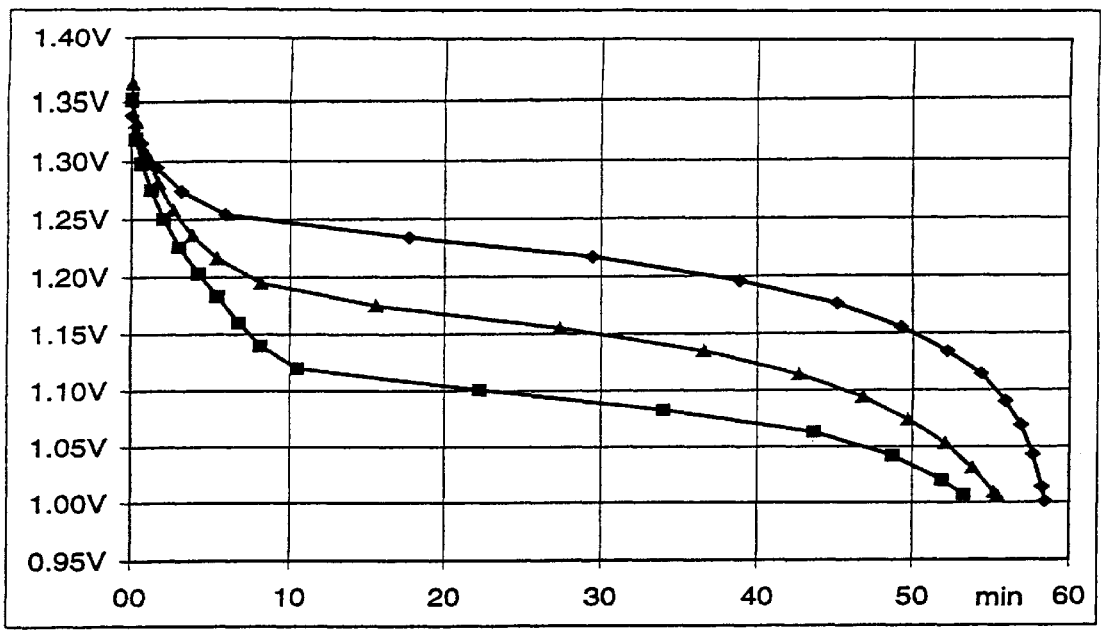

The changes to a battery's characteristics caused by aging and memory effect will be explained in the following by way of example with reference to FIG. 1 presenting a rechargeable battery's typical discharge curves. The top curve shows the characteristic of a new battery's voltage plotted as a function of time, which from the fully charged state (voltage of 1.35 V) is completely discharged (voltage <1 V) over a period of 50 minutes. If the battery is operated for several years in such a way that it is always discharged for a few minutes only and then fully recharged, the bottom curve shown in FIG. 1 will be obtained if the battery is then completely discharged. Finally, if the battery is then fully recharged and completely discharged again several times, the result will be the middle curve shown in FIG. 1. The difference between the top and the middle curve is due to aging, while the difference between the bottom and the middle curve is owed to the memory effect.

The discharge characteristics of various makes of non-rechargeable battery also differ in a way presentable in similar manner to that in FIG. 1, even when the same type and the same size of battery is concerned.

From DE 44 37 647 A1 there is known a method which, based on the method inferable from the above mentioned DE 41 31 981 A1, enables a more accurate indication of the "low charge" status of a rechargeable battery because it makes allowance for the change of its characteristics arising in the course of time. The "low charge" status of a battery is understood to be that status in which the battery is discharged to a specific residual charge. For this purpose a counter is used for recording the time which elapses until the battery is discharged via a connected load to the point where its voltage has dropped to a "low charge" voltage. In a first version, if this time is shorter than a predetermined minimum time, then an indicator for the "low charge" status is not activated until after the minimum time has expired. In a second version, if this minimum time is not exceeded for the first time until after the apparatus has been used for several years for example, then the "low charge" voltage is lowered by a specific amount and the "low charge" indicator is not activated until the lowered "low charge" voltage is reached. In this way the indicator of the "low charge" status is adapted, albeit relatively roughly, to the change of battery characteristics.

It is an object of the present invention to provide a method for determining the status of a battery in which the battery is discharged to a minimum residual charge, which is suitable for implementation with minimum effort, independent of the battery's make, and sufficiently accurate in spite of the battery's aging and/or memory effect.

In the method of the present invention, the time is measured which elapses after full charging of the rechargeable battery until the battery is discharged via a connected load to the point where the battery voltage has dropped to a first voltage threshold value. In this process it is assumed that the load's current consumption is essentially constant on a time average. When the first voltage threshold value is reached, it is lowered by an amount dependent on the measured discharge time. If the battery is further discharged via the load so that the battery voltage drops further, the reaching of the lowered voltage threshold value is taken as an indicator for the battery's discharge to a specific residual charge, i.e., for the existence of a status referred to as the battery's "low-charge" status. A suitable indicating device can be used to indicate the reaching of the "low charge" status. After detection of the "low charge" status, the load can be operated with the still remaining stored residual charge for a specific minimum time of several minutes, for example. In this way the user of an apparatus containing the load, e.g., an electric shaver or an electric toothbrush, is given timely notice of the need to recharge the battery of the apparatus.

In practice it may happen that a battery being discharged via a connected load adopts the voltage corresponding to the first voltage threshold value several times. If the load is switched off shortly after the battery voltage has dropped below the first voltage threshold value, the battery will recover and its voltage may rise to a value higher than the first voltage threshold value. If the load is then switched on again, the battery voltage will drop once more from a value higher than the first voltage threshold value to a value lower than the first voltage threshold value. To prevent the determination of the residual charge being corrupted by such processes, the first voltage threshold value is lowered in the method of the present invention preferably only when it is reached the first time after the rechargeable battery is fully charged.

Particularly good adaptation of the method of the present invention to typical battery characteristics is achieved when the amount by which the first voltage threshold value is lowered is greater the shorter the measured discharge time. With a new or nearly new rechargeable battery the measured discharge time exceeds a specific maximum time. In this case there is no need to lower the first voltage threshold value.

If the rechargeable battery is partly recharged again before the battery voltage has dropped to the first voltage threshold value for the first time, the measured discharge time is reduced by an amount corresponding to the supplied charge. If the battery is partly recharged again after the voltage threshold value was already lowered, the lowered voltage threshold value will be retained until the battery is fully charged again. After fully charging or replacing the rechargeable battery, the measured discharge time is reset to "zero" and the lowered voltage threshold value reset to the first voltage threshold value.

The above described method of the present invention can be used in similar manner for a non-rechargeable battery. In this case, however, the time does not begin to be measured after fully charging the battery but with the battery's new status or after an empty battery is replaced by a full one. In this way it is possible to make the greatest possible use of every battery's stored charge, regardless of its make.

The present invention will be explained in the following with reference to an embodiment illustrated in the accompanying drawing. Further versions are described in the description. In the drawing, FIG. 1 is a graphical representation of discharge curves, known in the art, of a rechargeable battery; and FIG. 2 is a graphical representation of the method of the present invention.

Figure 2:
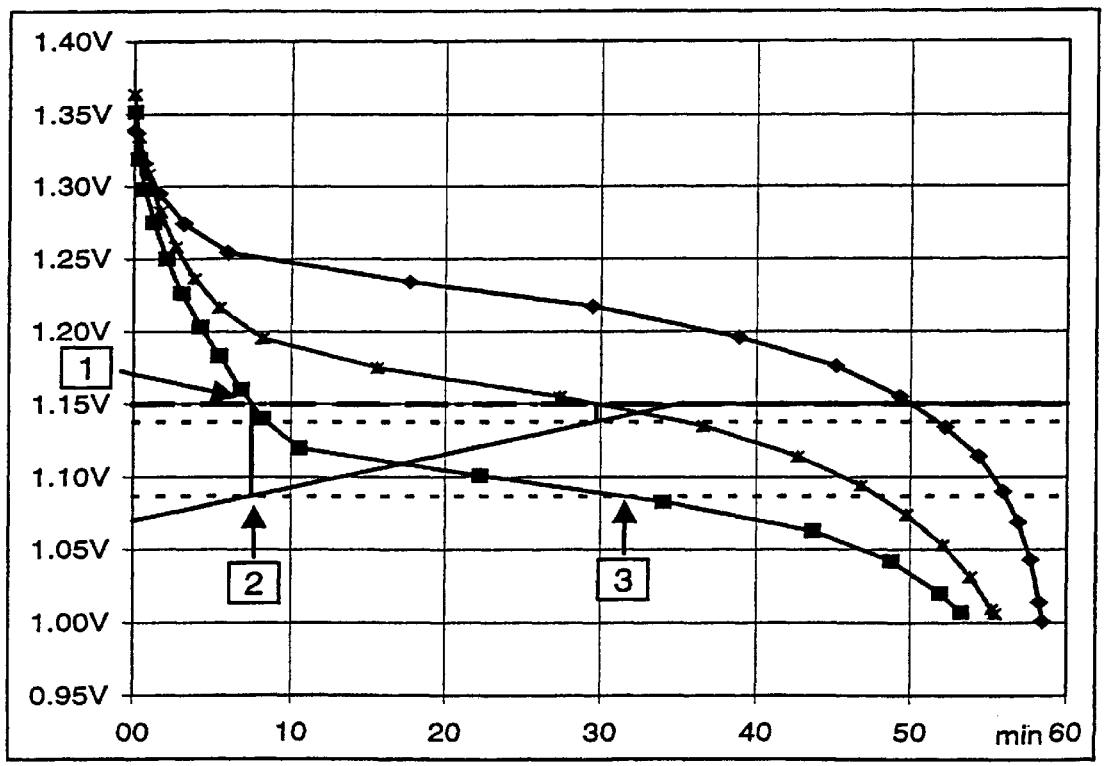

The discharge curves shown in FIG. 2 correspond to the curves already known from FIG. 1. However, FIG. 2 shows in addition the first voltage threshold value, the lowered voltage threshold values belonging to the bottom and middle curve, and the amount by which the first voltage threshold value is lowered in each case. The dependent relationship of the amount by which the value is lowered to the measured discharge time is also shown.

In the example of FIG. 2, the first voltage threshold value equals 1.15 V. It is represented by a horizontal broken line. The amounts by which the first voltage threshold value is lowered are shown as vertical lines drawn in full downwards from the points of intersection of the bottom and middle discharge curve with the first voltage threshold value. The lowered voltage threshold values are shown at the bottom end of these lines as horizontal dotted lines. An inclined straight line indicates that the amount by which the first voltage threshold value is lowered is greater the shorter the measured discharge time. It is also evident that in this example the first voltage threshold value is not lowered at all if the measured discharge time is longer than around 35 minutes.

The process flow of the method of the present invention is made clear in FIG. 2 by the numerals 1, 2 and 3, which in the example of the bottom curve refer to the dropping of the battery voltage and the reaching of the first voltage threshold value, the lowering of the voltage threshold value from 1.15 V to 1.08 V, approximately, and the reaching of the lowered voltage threshold value and indication of the "low charge" status.

In another example not presented in the Figures there is a relationship of non-linear dependence between the amount by which the value is lowered and the measured discharge time.

The "low charge" status can be indicated by a visual, audible or haptic indicating device known in the art.

What is claimed is:

1. A method for determining a charge status of a battery which began as fully charged at an initial time said method comprising:
    monitoring the battery voltage;
    measuring a discharge time which elapses from the initial time until the monitored battery voltage has dropped to a first voltage threshold value;
    upon the monitored battery voltage reaching the first voltage threshold value, lowering the first voltage threshold value by an amount dependent on the measured discharge time;
    detecting when the monitored battery voltage has later dropped to the lowered first voltage threshold value; and
    upon detecting when the monitored battery voltage has dropped to the lowered first voltage threshold value, then indicating that the battery has discharged to a residual charge state.

2. The method as claimed in claim 1, wherein the battery is a rechargeable battery and wherein after each full charge the first voltage threshold value is lowered only when the battery voltage drops to said value for the first time.

3. The method as claimed in claim 2, wherein the first voltage threshold value is not lowered if the measured discharge time exceeds a specific maximum time.

4. The method as claimed in claim 2, wherein the lowering also comprises indicating through an indicating device the lowering of the first voltage threshold value to the lowered first voltage threshold value.

5. The method as claimed in claim 2, wherein the battery is a rechargeable battery and wherein said method further comprises:
    detecting that the battery has been fully recharged; and
    upon detecting that the battery has been fully recharged, resetting the measured discharge time to zero and resetting the lowered first voltage threshold value to the first voltage threshold value.

6. The method as claimed in claim 2, further comprising:
    detecting that the battery has been replaced; and
    upon detecting that the battery has been replaced, resetting the measured discharge time to zero and resetting the lowered first voltage threshold value to the first voltage threshold value.

7. The method as claimed in claim 1, wherein the amount by which the first voltage threshold value is lowered is greater the shorter the measured discharge time.

8. The method as claimed in claim 7, wherein the first voltage threshold value is not lowered if the measured discharge time exceeds a specific maximum time.

9. The method as claimed in claim 7, wherein the lowering also comprises indicating through an indicating device the lowering of the first voltage threshold value to the lowered first voltage threshold value.

10. The method as claimed in claim 7, wherein the battery is a rechargeable battery and wherein said method further comprises:
    detecting that the battery has been fully recharged; and
    upon detecting that the battery has been fully recharged, resetting the measured discharge time to zero and resetting the lowered first voltage threshold value to the first voltage threshold value.

11. The method as claimed in claim 7, further comprising:
    detecting that the battery has been replaced; and
    upon detecting that the battery has been replaced, resetting the measured discharge time to zero and resetting the lowered first voltage threshold value to the first voltage threshold value.

12. The method as claimed in claim 1, wherein the first voltage threshold value is not lowered if the measured discharge time exceeds a specific maximum time.

13. The method as claimed in claim 1, wherein the lowering also comprises indicating through an indicating device the lowering of the first voltage threshold value to the lowered first voltage threshold value.

14. The method as claimed in claim 1, wherein the battery is a rechargeable battery and wherein said method further comprises:
    detecting that the battery has been fully recharged; and
    upon detecting that the battery has been fully recharged, resetting the measured discharge time zero and resetting the lowered first voltage threshold value to the first voltage threshold value.

15. The method as claimed in claim 1, further comprising:
    detecting that the battery has been replaced; and
    upon detecting that the battery has been replaced, resetting the measured discharge time to zero and resetting the lowered first voltage threshold value to the first voltage threshold value.

* * * * *

UNITED STATES PATENT AND TRADEMARK OFFICE
CERTIFICATE OF CORRECTION

| | |
|---|---|
| PATENT NO. : 6,236,189 B1 | Page 1 of 1 |
| DATED : May 22, 2001 | |
| INVENTOR(S) : Michael Franke | |

It is certified that error appears in the above-identified patent and that said Letters Patent is hereby corrected as shown below:

<u>Column 4,</u>
Line 54, insert -- to -- after "time".

Signed and Sealed this

Twenty-third Day of April, 2002

Attest:

Attesting Officer

JAMES E. ROGAN
*Director of the United States Patent and Trademark Office*